United States Patent
Park et al.

(10) Patent No.: US 7,091,660 B2
(45) Date of Patent: Aug. 15, 2006

(54) POLYMER ORGANIC LIGHT EMITTING DIODE

(75) Inventors: Joon-Young Park, Seoul (KR); Jae-Jung Kim, Kyungki-do (KR)

(73) Assignee: Samsung SDI Co., Ltd., Suwon-si (KR)

( * ) Notice: Subject to any disclaimer, the term of this patent is extended or adjusted under 35 U.S.C. 154(b) by 214 days.

(21) Appl. No.: 10/670,232

(22) Filed: Sep. 26, 2003

(65) Prior Publication Data

US 2004/0140759 A1 Jul. 22, 2004

(30) Foreign Application Priority Data

Jan. 22, 2003 (KR) ...................... 10-2003-0004249

(51) Int. Cl.
*H01J 1/62* (2006.01)
*H01J 63/04* (2006.01)
*H01J 1/76* (2006.01)

(52) U.S. Cl. ...................... 313/512; 313/504
(58) Field of Classification Search ......... 313/498–512
See application file for complete search history.

(56) References Cited

U.S. PATENT DOCUMENTS

| | | | |
|---|---|---|---|
| 6,087,196 A | 7/2000 | Sturm et al. | 438/29 |
| 6,373,453 B1 | 4/2002 | Yudasaka | 345/76 |
| 6,380,672 B1 | 4/2002 | Yudasaka | 313/504 |
| 6,388,377 B1 | 5/2002 | Kobayashi | 313/505 |
| 6,774,392 B1 * | 8/2004 | Humbs et al. | 257/40 |

FOREIGN PATENT DOCUMENTS

| | | |
|---|---|---|
| EP | 0423283 | 1/1995 |
| EP | 0908725 | 4/1999 |
| EP | 0940796 | 9/1999 |
| EP | 0940797 | 9/1999 |
| EP | 0989778 | 3/2000 |
| JP | 2001-230073 | 8/2001 |
| KR | 2001-0082530 | 8/2001 |
| WO | WO9013148 | 11/1990 |
| WO | WO9828946 | 7/1998 |
| WO | WO9943031 | 8/1999 |
| WO | WO9966483 | 12/1999 |
| WO | WO0012226 | 3/2000 |
| WO | WO0019776 | 4/2000 |

OTHER PUBLICATIONS

*Office Action* from the Korean Industrial Property Office issued in Applicant's corresponding Korean Patent Application No. 10-2003-0004249 dated Mar. 29, 2005 (English translation is attached).

* cited by examiner

*Primary Examiner*—Mariceli Santiago
*Assistant Examiner*—Elizabeth Rielley
(74) *Attorney, Agent, or Firm*—Robert E. Bushnell, Esq.

(57) ABSTRACT

An organic light emitting diode (OLED) is used to realize a full-color display device. More particularly, a polymer OLED is used to increase uniformity in thickness of a layer formed of polymer ink, and to prevent mixing of colors. The OLED includes a substrate having a first electrode layer formed thereon in a predetermined pattern, an insulator layer formed on the substrate forming a channel in a predetermined pattern, an organic polymer layer formed based on the channel and having at least an emission layer, a barrier formed at either side of the insulator layer of at least one end of the channel for preventing ink for the organic polymer layer from running out of both ends of the channel, and a second electrode layer formed on the polymer organic layer.

20 Claims, 10 Drawing Sheets

POLYMER ORGANIC LIGHT EMITTING DIODE

CLAIM OF PRIORITY

This application claims the benefit under 35 U.S.C. §119 of Korean Application No. 2003-4249 filed on 22 Jan. 2003 in the Korean Intellectual Property Office, the disclosure of which is incorporated herein by reference.

BACKGROUND OF THE INVENTION

1. Field of the Invention

The present invention relates to an organic light emitting diode (OLED) for realizing a full-color display device and, more particularly, to a polymer OLED which can increase uniformity in thickness of a layer formed of polymer ink and can prevent mixing of colors.

2. Description of the Related Art

OLEDs which can realize full-color display devices are largely divided into two types according to the organic material used: OLEDs employing low molecular materials; and OLEDs employing polymer high molecular materials.

A high molecular OLED is generally fabricated such that two opposite electrodes, that is, a cathode and an anode, are disposed on a substrate, and a hole transport layer (HTL) and an emission layer are provided between the anode and the cathode. In the polymer high molecular OLED, the HTL and the emission layer are formed of organic polymers. Recently, research into polymer OLEDs has been actively carried out because they are driven at a relatively lower voltage, consume small power, and can easily realize large, full-color display screens.

Organic layers, both as active and passive matrix types on the basis of polymer OLEDs, are fabricated according to the state of the art with printing techniques such as ink-jet printing.

In this known method, the light emitting polymers are liquified to form a so-called polymer ink. The polymer ink is printed onto a substrate via an ink-jet printing head.

The OLED, in the simplest case of a passive matrix display screen, is fabricated as follows.

First, a transparent substrate made from glass or plastic is coated with a transparent conductor material, such as indium tin oxide (ITO), to form an anode having a predetermined pattern.

In the next step, a hole transport layer (HTL) is formed of an organic material, for example, poly-(2,4)-ethylene-dihydroxy thiophene (PEDOT) or polyaniline (PANI). The HTL is deposited on the anode on the substrate by means of ink-jet printing or spin coating.

A polymer emission layer is then formed on the organic HTL by the ink-jet printing method as mentioned above. In order to obtain a full-color display screen, a red-emitting, a green-emitting and a blue-emitting polymer are imprinted. Following this, a cathode, e.g., from a layer of calcium and a layer of aluminum, is vapor-deposited.

Finally, the entire structural element is encapsulated. The cathode and the anode are then connected to an electronic driving system.

In producing the OLED, in order to print the polymers for each pixel, a partition structure for preventing ink containing various colors from penetrating into neighboring pixels is necessary. The partition structure is largely divided into two types according to printing methods.

First, an organic layer may be formed at an emitting region only by accurately dropping an inklet for each sub-pixel of a pixel. In this case, a partition structure is provided to define sub-pixels. In order to form an organic layer at an emitting region only, it is necessary to drop an inklet into each sub-pixel accurately, resulting in prolonged processing time. Also, since high accuracy is required, defects may be easily generated.

Alternatively, rather than forming an organic layer only at an emitting region, all pixels may be covered by an organic layer. According to this method, since it is not necessary to limit a pixel to a predetermined size, a reduction in aperture ratio can be prevented. In this case, in addition to a partition structure for defining the respective sub-pixels, another partition structure for separating pixels having various colors from one another is also provided. Such a partition structure for separating pixels having various colors from one another is generally formed in a line array.

For example, U.S. Pat. No. 6,388,377 to Kobayashi, entitled ELECTROLUMINESCENT ELEMENT WITH BANKS INTERSECTING ANODE GROUP, issued on May 14, 2002, discloses a passive matrix type OLED in which line-patterned channels are formed to be orthogonal to an anode and an emission layer and a cathode are defined by the channels. U.S. Pat. No. 6,380,672 to Yudasaka, entitled ACTIVE MATRIX DISPLAY DEVICE, issued on Apr. 30, 2002, and U.S. Pat. No. 6,373,453 to Yudasaka, entitled ACTIVE MATRIX DISPLAY, issued on Apr. 16, 2002, disclose active matrix type OLEDs in which a partition structure is formed at a TFT region excluding pixel regions where light emission occurs. Also, the fabrication of organic light emitting diodes on a polymer basis is described in the European Patent Publication No. 0423283 B1 to Fiend, entitled ELECTROLUMINESCENT DEVICES, published on 25 Jan. 1995 and PCT publication No. WO 9013148 to Fiend et al., entitled ELECTROLUMINESCENT DEVICES, published on 1 Nov. 1990. The fabrication of OLEDs by means of printing methods, such as ink-jet printing, is described in the following U.S., European and PCT Publications: European Patent Publication No. 0908725 A1 to Fukushima et al., entitled MANUFACTURE OF A MICROSENSOR DEVICE, published on 14 Apr. 1999, European Patent Publication No. 0940796 A1 to Yudasaka, entitled ACTIVE MATRIX DISPLAY, published on 8 Sep. 1999, European Patent Publication No. 0940797 A1 to Yudasaka, entitled ACTIVE MATRIX DISPLAY, published on 8 Sep. 1999, European Patent Publication No. 0989778 A1 to Kiguchi, entitled SUBSTRATE FOR PATTERNING THIN FILM AND SURFACE TREATMENT THEREOF, published on 29 Mar. 2000; PCT publication No. WO 9943031 to Friend et al, entitled DISPLAY DEVICES, published on 26 Aug. 1999, PCT publication No. WO 9966483 to Heeks et al., entitled BACKLIT DISPLAYS, published on 23 Dec. 1999, PCT publication No. WO 9828946 to Thompson et al., entitled MULTICOLOR DISPLAY DEVICES, published on 2 Jul. 1998, U.S. Pat. No. 6,087,196 to Sturm et al., entitled FABRICATION OF ORGANIC SEMICONDUCTOR DEVICES USING INK JET PRINTING, issued on Jul. 11, 2000, PCT publication No. WO 0012226 to Jones et al., entitled FULL COLOR ORGANIC LIGHT EMITTING DIODE DISPLAY AND METHOD FOR MAKING THE SAME USING INKJET FABRICATION, published on 9 March 2000, and PCT publication No. WO 0019776 to Young et al., entitled METHOD AND DEVICE FOR MANUFACTURING AN ELECTROLUMINESCENT DISPLAY SCREEN, published on 6 Apr. 2000.

In such prior arrangements and methods, the HTL and the emission layer exhibit nonuniformity in layer thickness at the upper and lower rims thereof, which are effective areas for electro-luminescence emission. This occurs because the layer thicknesses of the HTL and polymer emission layer gradually become thinner, or the HTL ink and polymer ink run out from the channels.

In addition to the problem of nonuniformity in layer thickness, ink may run out into neighboring channels through walls of the channels, causing mixing of colors.

SUMMARY OF THE INVENTION

The present invention provides a polymer organic light emitting diode (OLED) which can prevent ink from a hole transport layer (HTL) or polymer emission layer from running out from channels, and in which the HTL or polymer emission layer has a uniform layer thickness.

The present invention also provides a polymer OLED which can prevent mixing of colors among pixels.

In accordance with an aspect of the present invention, there is provided an organic light emitting diode (OLED) comprising a substrate having a first electrode layer formed thereon, an insulator layer formed on the substrate having the first electrode layer and forming a channel in a predetermined pattern, an organic polymer layer formed based on the channel and having at least an emission layer, a barrier formed at either side of the insulator layer of at least one end of the channel for preventing ink for the organic polymer layer from running out from both ends of the channel, and a second electrode layer formed on the polymer organic layer.

The barrier may extend lengthwise in a direction perpendicular to the channel.

The barrier may also extend lengthwise in a direction inclined relative to the channel.

The barrier may be spaced by a predetermined distance from a lateral surface of a neighboring insulator layer. Also, the barrier may extend to the lateral surface of the neighboring insulator layer.

The barrier may comprise at least one first barrier preventing the polymer ink from running out from both ends of the channel, and at least one second barrier preventing the polymer ink from running in from neighboring channels.

The first and second barriers may incline lengthwise with respect to the channel, the barriers extending in opposite directions.

Also, the first barrier may extend lengthwise toward the center of the channel, and the second barrier may extend outward from the channel.

The height of the barrier is preferably greater than or equal to 50 nm, and smaller than or equal to the height of the insulator layer.

Also, at least one blocking member for interrupting outflow of the polymer organic layer may be provided substantially at the center of both ends of each channel.

The shape of the blocking member may be one of a cuboid, a cylinder, a pyramid and a wedge (V-shape).

The blocking member includes at least two elements of a wedge shape, the centers of the wedge being opposite to each other.

The width of the blocking member is, preferably, smaller than or equal to the width of the channel.

The height of the barrier is, preferably, greater than or equal to 50 nm, and smaller than or equal to the height of the insulator layer.

The polymer organic layer may be formed by coating a liquid polymer organic material along the channel by inkjet printing.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
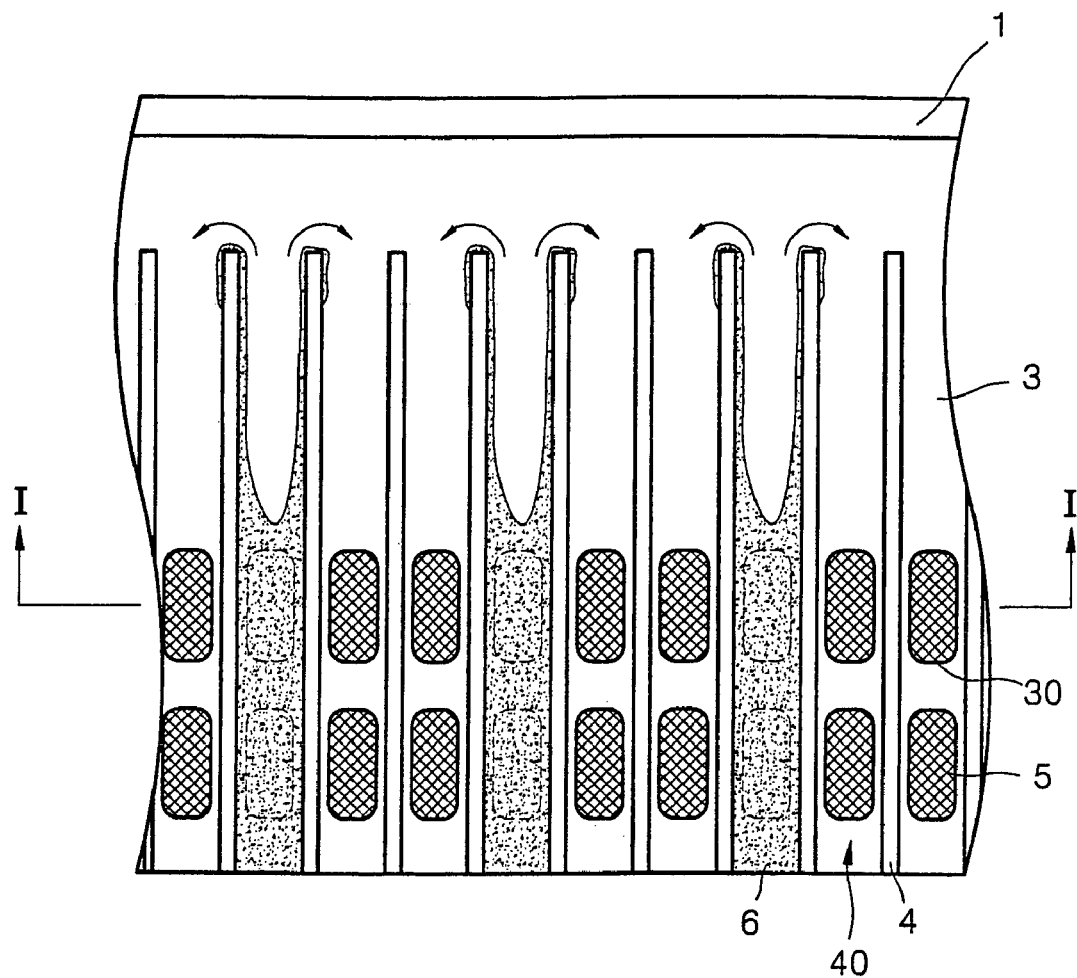
FIGS. 1A and 1B are a plan view and a cross-sectional view taken along the line I—I of a passive matrix substrate for a polymer OLED, showing the state in which ink from a hole transport layer (HTL) or polymer emission layer is printed onto a passive matrix substrate to form a polymer OLED.

Preferred embodiments of the present invention will now be described in detail with reference to the accompanying drawings. An explanation will be given with the example of a passive matrix type polymer OLED. Although not shown in the drawings, the invention can also be applied to active matrix type polymer OLED. The structure of the substrate shown in the following drawings is substantially the same as that of the substrate shown in FIGS. 1A and 1B. The same elements are denoted by the same reference numerals.

Figure 1B:
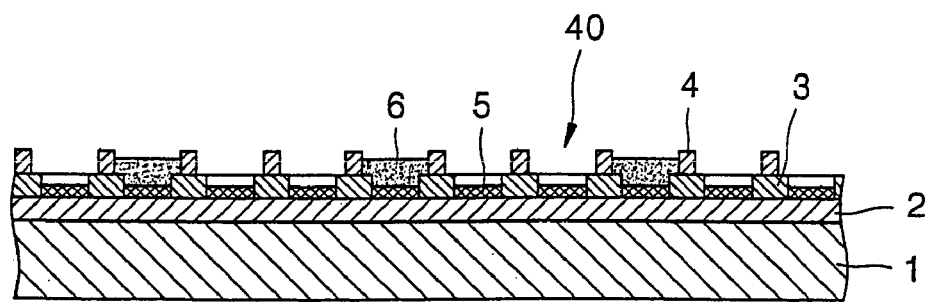

FIGS. 1A and 1B are a plan view and a cross-sectional view taken along the line I—I of a passive matrix substrate for a polymer OLED, showing the state in which ink from a hole transport layer (HTL) or polymer emission layer is printed onto a passive matrix substrate to form a polymer OLED.

More specifically, FIGS. 1A and 1B show the state of a glass substrate 1 on which an organic polymer layer is formed in a polymer OLED. A first electrode layer 2 having a predetermined pattern is formed on the glass substrate 1. A first insulator layer 3 made from a photo-resist material, and a second insulator layer 4 forming channels 40, are formed on the first electrode layer 2. Predetermined openings 30 are formed in the first insulator layer 3 by exposing and developing steps so that a predetermined area of the first electrode layer 2 is exposed through the openings 30 to define sub-pixels. In such a structure, the first electrode layer 2 may serve as an anode.

Polymer material layers, that is, a hole transport layer 5 and a polymer emission layer 6, are formed on the substrate 1. As described above, the polymer material layers can be printed by inkjet printing. Generally, multi-channel printing heads are used for the purpose of printing multiple channels at once. With these printing heads, it is possible to print a plurality of pixels simultaneously. For this purpose, several jets are provided in the printing head.

As shown in FIGS. 1A and 1B, polymer ink is printed along channels pre-structured by the second insulator layer 4 through the jets. The second insulator layer 4 ensures that the polymer ink does not flow into neighboring channels. In this way, red, green and blue emitting polymers can be printed in a line-shaped manner next to each other without causing any mixing of colors.

In other words, as a layer formed of an insulator material, such as a photo-resist material, forms the left and right boundary limitations of the lines constituting pixels of a full-display screen, ink forming the hole transport layer 5, as well as ink forming the polymer emission layer 6, can be printed into the pre-structured channels. In such a manner, red-, green-and blue-emitting polymer materials are imprinted in a predetermined manner without flowing into neighboring channels or causing any mixing of colors. Thus the above-described partition structures form the channels and print lattices or lines on a substrate that is then built up to the full-display screen.

In the printing of the polymer materials, as shown in FIG. 1B, the hole transport layer 5 is formed at all channels and the polymer emission layer 6 is printed thereon. The polymer emission layer 6 is printed in various. A plurality of channels of the respective are simultaneously printed by multiple heads.

As also shown in FIG. 1A, as the second insulator layer 4 defining the channels 40 provides only lateral limitation for the channels and the channels are open at the upper and lower rims, the polymer ink forming the emission layer 6 can easily run out from the upper and lower rims of the opened channels. Therefore, the amount of ink at the upper and lower rims of the channels is less than that at central portions of the channels. Accordingly, after the HTL ink and the polymer ink are dried, the HTL and the emission layer exhibit nonuniformity in layer thickness at the upper and lower rims thereof, which are effective areas for electroluminescence emission. This occurs because the layer thicknesses of the HTL- and polymer emission layer gradually become thinner, or the HTL ink and polymer ink run out from the channels.

Figure 2A:
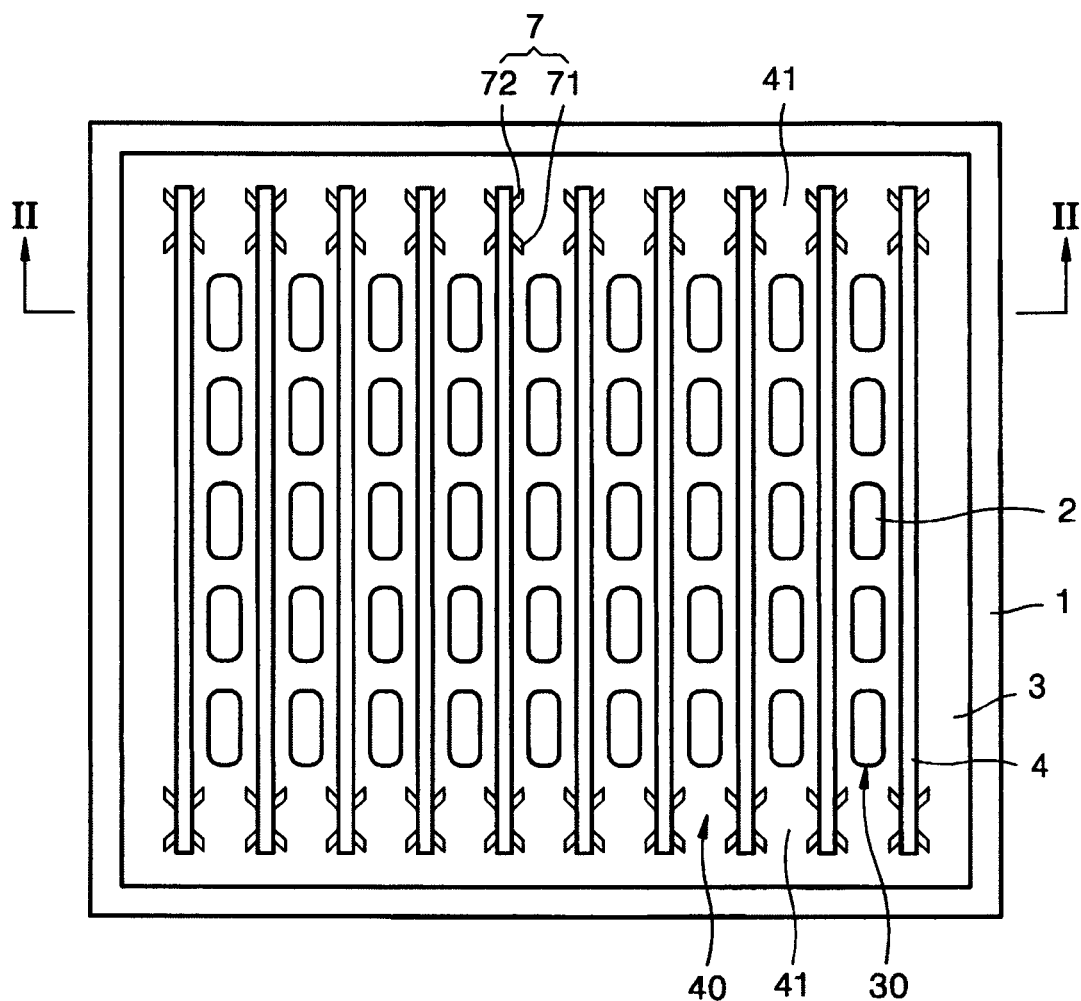
FIGS. 2A and 2B are a plan view and a cross-sectional view taken along the line II—II, showing the structure of a substrate for a polymer OLED according to an embodiment of the present invention.
Figure 2B:
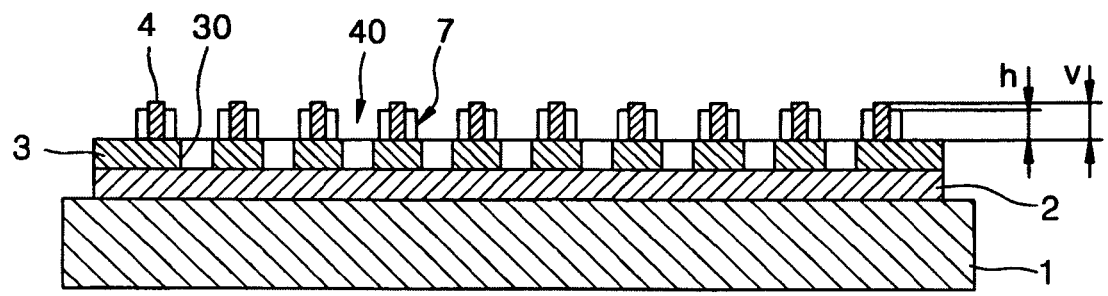

FIGS. 2A and 2B are a plan view and a cross-sectional view, respectively, taken along the line II–II, showing the structure of a substrate for a polymer OLED according to an embodiment of the present invention, in which HTL ink and polymer ink are not yet printed onto the substrate.

Referring to FIGS. 2A and 2B, a first electrode layer 2 having a predetermined pattern is formed on a substrate 1 formed of glass, quartz or transparent plastic. The first electrode layer 2 may be formed of a transparent conductor material, e.g., ITO. Although not shown, the first electrode layer 2 maybe patterned in stripes having a predetermined pattern. The distance between two neighboring patterns of the first electrode layer 2 is typically 80 µm but is not limited thereto. The first electrode layer 2 functions as an anode. Although a connection terminal, connecting the first electrode layer 2 to the outside, is not shown in FIGS. 2A and 2B, the first electrode layer 2 extends outside toward a connection terminal encapsulated along the edge of the substrate.

In the case of an active matrix type polymer OLED, a TFT layer having one or more thin film transistors (TFTs) and capacitors may be provided between the first electrode layer 2 and the substrate 1, and the first electrode layer 2 may be patterned such that it is connected to a drain electrode of a drive TFT of each sub-pixel.

Insulator layers made of an organic or inorganic insulator material are formed on the substrate 1 having the first electrode layer 2. The insulator layers define the upper portion of the substrate 1 having the first electrode layer 2 in a predetermined pattern. At least one or more channels 40 having a predetermined pattern are defined by the insulator layers, and an organic polymer layer is formed based on the channel 40 patterned by the insulator layers, which will be described below.

In the OLED according to the present invention, the insulator layers include a first insulator layer 3 and a second insulator layer 4, as shown in FIGS. 2A and 2B. The first insulator layer 3 has openings 30 to partially expose the first electrode layer 2. The second insulator layer 4 is formed on the first insulator layer 3, defining the channels 40.

In a preferred embodiment of the present invention, the first insulator layer 3 is an acryl photo-resist material, and is formed on the substrate by means of a known method, such as spin coating, followed by exposure and development, thereby forming the openings 30. Predetermined portions of the first electrode layer 2 are exposed by the openings 30, thereby defining sub-pixels.

The first insulator layer 3 may have a thickness of 100 to 500 nm. The openings 30 formed in the first insulator layer 3 are rectangular in shape (40×140 µm in surface area), as shown in FIG. 2A, or circular in shape (approximately 20 µm in radius), although not shown. In addition, the openings 30 may be formed in various shapes, such as hexagonal.

After forming the first insulator layer 3, the second insulator layer 4 made of a photo-resist material is subjected to spin coating, followed by exposure and development, thereby forming cuboid-shaped structures. Typical dimensions of these cuboids are 1 to 5 µm in height, and 5 to 20 µm in width. The lengths of the cuboids range from several millimeters to centimeters depending on the length of the diode. The cuboids of the second insulator layer 4 are arranged in parallel to each other, and are positioned parallel to, and in the center between, each of the respective rows of the openings 30. In such a manner, the channels 40 for the HTL- or polymer ink are constructed. These channels 40 limit the individual rows of red, green and blue pixels, and prevent ink from flowing into the neighboring lines. Both ends 41 of the channel 40 provided lengthwise are opened outward. The first and second insulator layers 3 and 4, respectively, can be formed integrally and simultaneously. Otherwise, the second insulator layer 4 can only be employed.

In the substrate 1 having the above-described structure, barriers 7 for preventing polymer ink from running out are formed at either side of the insulator layer 4 and at either end of the channel 40.

The barriers 7 are also formed of a photo-resist material, and can be integrally formed with the second insulator layer 4.

In a preferred embodiment of the present invention, as shown in FIG. 2A, the barriers 7 include at least one first barrier 71 preventing the polymer ink from running out from the ends 41 of the channel 40, and at least one second barrier 72 preventing the polymer ink from flowing in from neighboring channels. The first and second barriers 71 and 72, respectively, may extend lengthwise in a direction inclined with respect to the second insulator layer 4 forming the channels 40. The first barrier 71 is, preferably, formed so as to incline in a direction opposite to an inward flow, that is, toward the inside of the channel 40. The second barrier 72 is, preferably, formed so as to incline in a direction opposite to an outward flow, that is, toward the outside of the channel 40.

Thus, the first and second barriers 71 and 72, respectively, can achieve a dual effect of preventing polymer ink from running out into neighboring channels. In other words, flow of polymer ink outside the channel 40 can be prevented by the first barrier 71, and introduction of polymer ink from neighboring channels can be prevented by the second barrier 72.

According to the present invention, the height of the barrier 7 is, preferably, set to be high enough to prevent the polymer ink from flowing in a direction toward the ends 41 of the channel 40. Thus, when the HTL ink is formed to a height of approximately 50 nm and the emission layer ink is formed to a height of approximately 100 nm, it is sufficient that the height of the barrier 7 be 50 nm or greater.

Also, the barrier 7 has a height corresponding to, but not necessarily the same as, that of the channel 40.

According to the present invention, the height of the barrier 7, denoted by h, as shown in FIG. 2B, is greater than 50 nm, but it is not greater than the height of the second insulator layer 4, denoted by v. Thus, the height h can be set to be in the range of 50 nm to 5 μm.

The width of the barrier 7 is, preferably, less than half the width of the channel 40. In other words, since the barrier 7 extends from inner walls of both sides of the channel 40, that is, sides of the second insulator layer 4, the width of the barrier 7 is set to be less than half the width of the channel 40.

HTL ink and emission layer ink are printed onto the above-described substrate through channels by inkjet printing. With multiple heads, it is possible to print a plurality of pixels simultaneously.

Figure 3A:
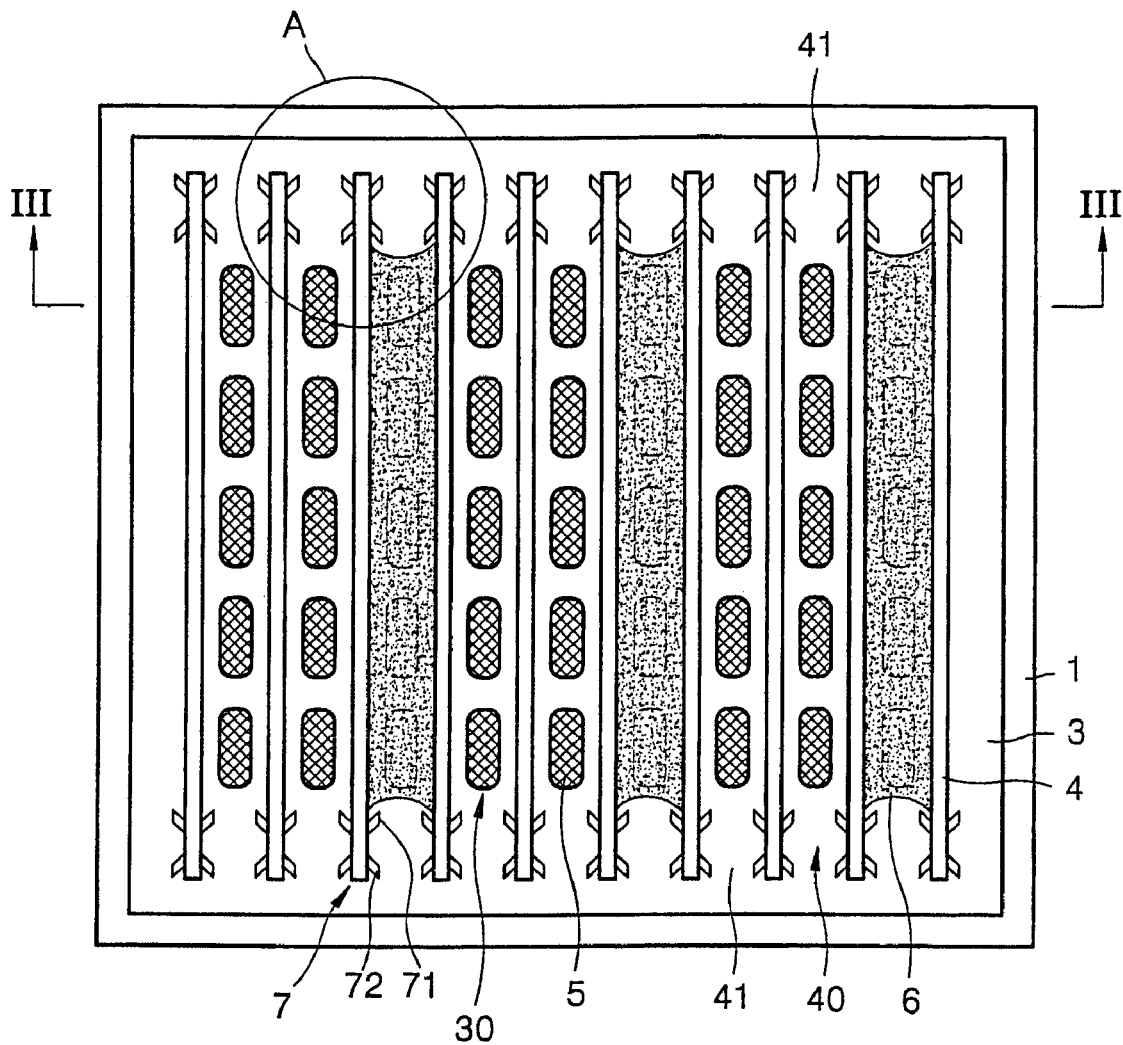
FIGS. 3A and 3B are a plan view and a cross-sectional view taken along the line III—III, showing states in which HTL ink and polymer ink are printed onto the substrates shown in FIGS. 2A and 2B, respectively.
Figure 3B:
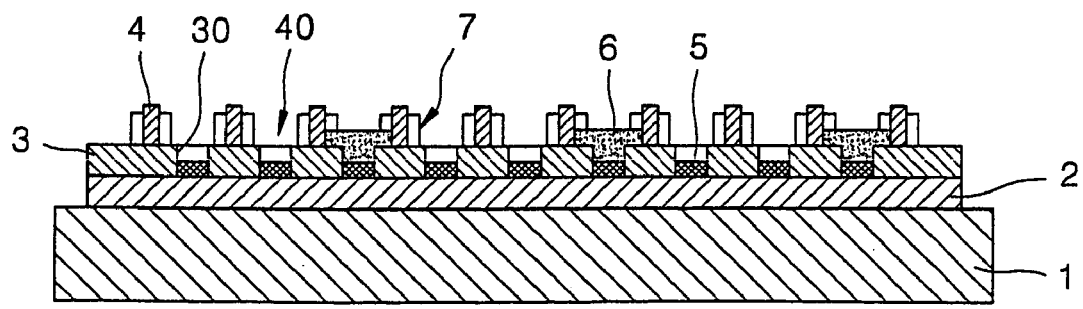

FIGS. 3A and 3B illustrate a printing process in which HTL ink is printed, and then emission layer ink is printed. As shown in FIGS. 3A and 3B, the HTL 5 is printed on an opening 30 formed by the first insulator layer 3, and the emission layer 6 is printed thereon. Printing of the emission layer 6 is completed before reaching ends 41 of the channel 40 where there is no pixel.

Figure 4:
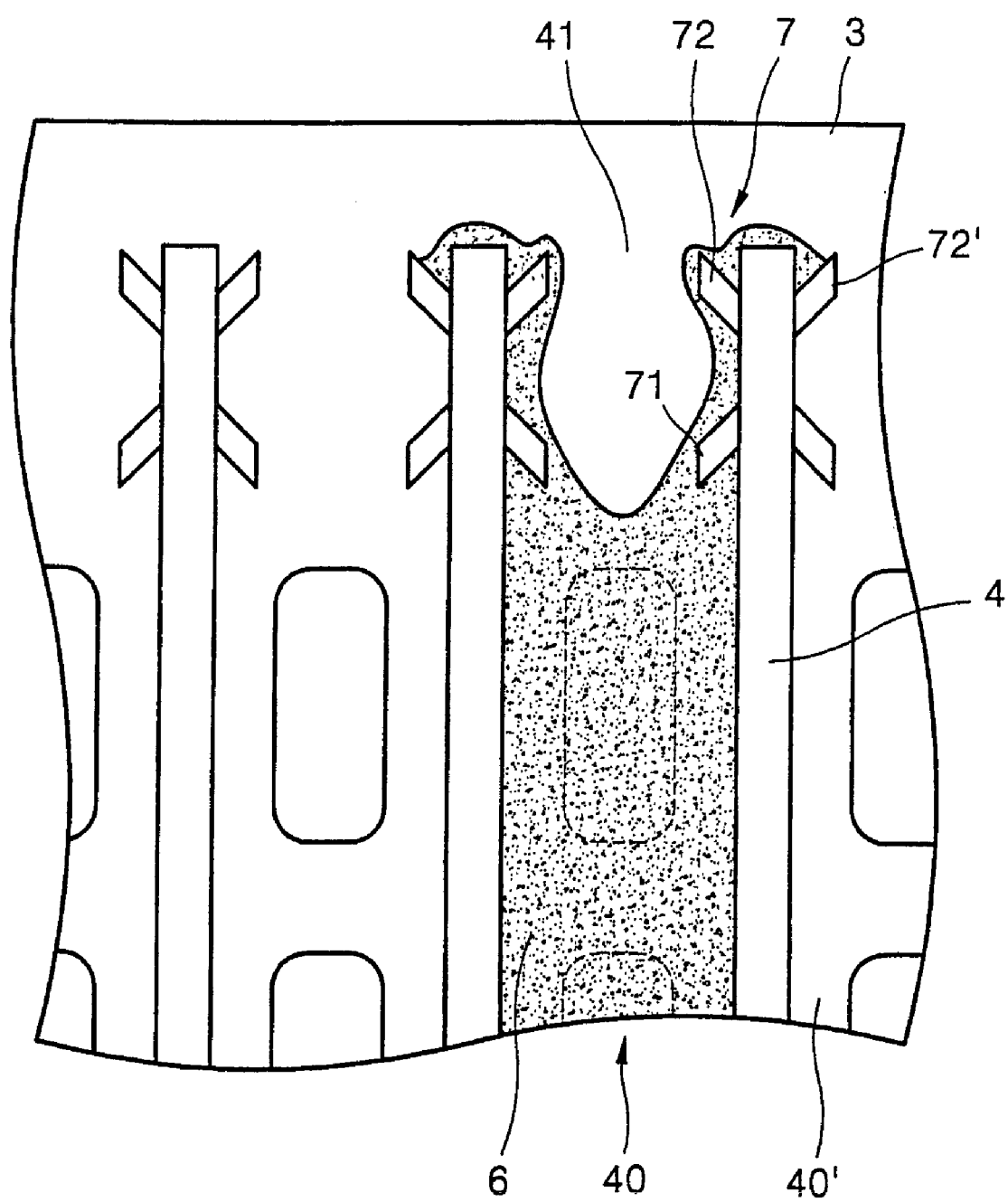
FIG. 4 is a partially enlarged plan view of a portion "A" shown in FIG. 3A.

FIG. 4 is a partially enlarged plan view of a portion "A" shown in FIG. 3A, and is provided to explain the operation of the barrier 7 at the ends 41 of the channel 40. As shown in FIG. 4, when printing of the emission layer 6 is completed before the ends 41 of the channel 40 are reached, emission layer ink flows out along the inner walls of the second insulator layer 4. Flow of the emission layer ink is interrupted by the first barrier 71. When the ink passes along the wall of the second insulator layer 4 so as to then flow into a neighboring channel 40', flow of the emission layer ink is also interrupted by a second barrier 72' of the neighboring channel 40'. Thus, the ink can be prevented from flowing into neighboring channels, thereby avoiding mixing of colors between channels.

Figure 5:
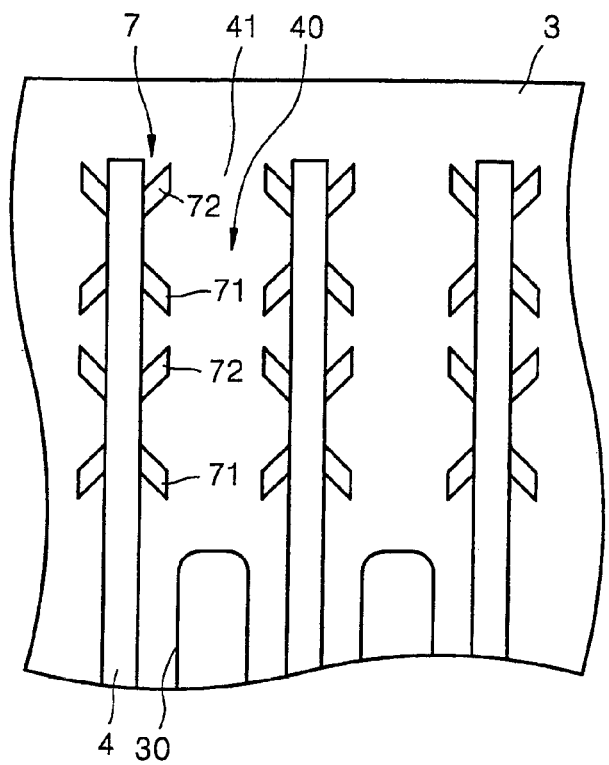
FIGS. 5 thru 11 are partially enlarged plan views of a portion of a substrate for each of polymer OLEDs according to various embodiments of the present invention.

The barrier 7 can be formed in various shapes. As shown in FIG. 5, the first and second barriers 71 and 72, respectively, may be provided as a pair sequentially for each channel 40. The barrier 7 provided in pairs can securely prevent ink from flowing along the second insulator layer 4.

Figure 6:
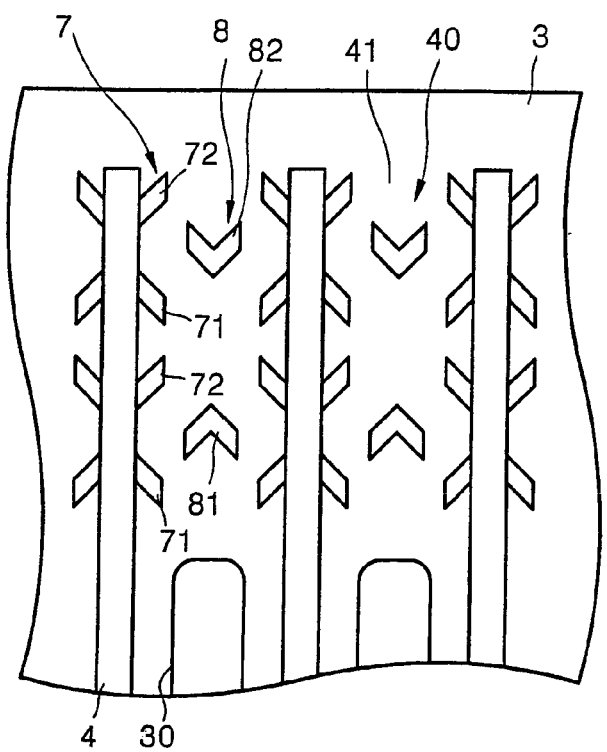

FIG. 6 shows the structure of a substrate for a polymer OLED according to another embodiment of the present invention. In addition to the first and second barriers 71 and 72, respectively, provided as a pair, as in FIG. 5, blocking members 8 may be further provided at both ends of the channel 40. The blocking members 8 are installed widthwise and substantially at the center of the channel, and increase uniformity of the organic layer by preventing polymer ink from flowing out of the channel 40.

Figure 7:
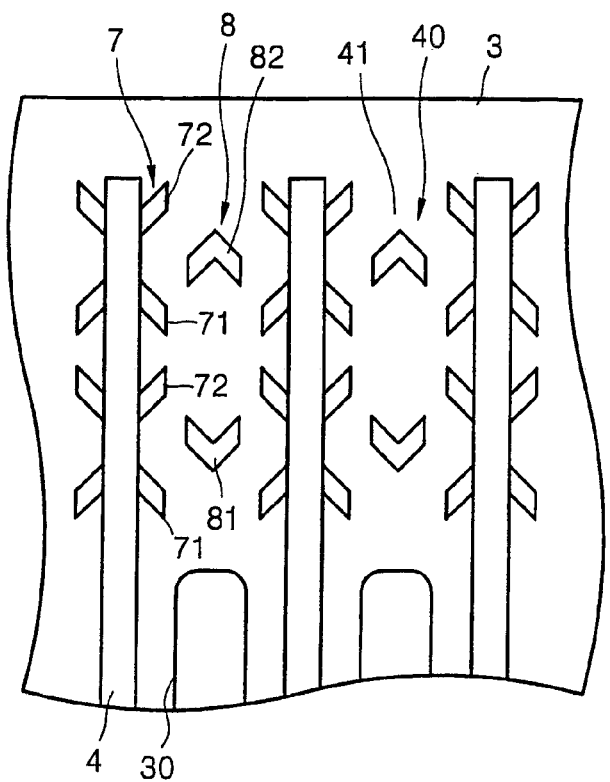

In the OLED shown in FIG. 6, the blocking members 8 may include a first member 81 and a second member 82. Each of members 81 and 82 maybe wedge-shaped (V-shaped), and the center of each of members 81 and 82 faces inward or outward with respect to the channel, as shown in FIGS. 6 and 7. Flow of ink is primarily interrupted by the first member 81, and remaining ink is also interrupted by the second member 82.

The first and second members 81 and 82, respectively, maybe bent in directions opposite to each other, as shown in FIG. 7.

Figure 8:
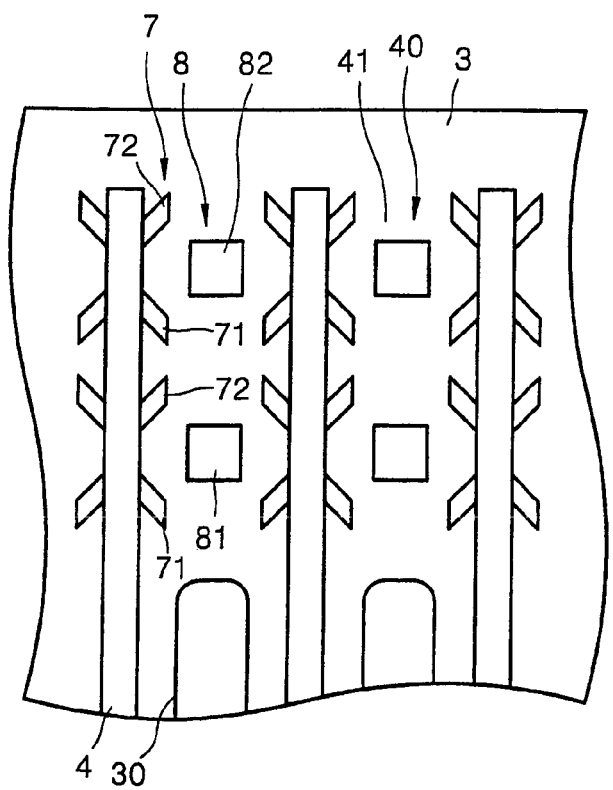

The blocking members 8 may be cuboidal, as shown in FIG. 8. Also, although not shown, the blocking members 8 may be cylindrical or pyramidal.

The blocking members 8 formed at a central portion of the channel are also formed from photo-resist material, as were the aforementioned barriers, and the dimensions thereof can vary according to device design. According to an embodiment of the present invention, the height of the blocking members 8 is, preferably, the same as that of the barriers 7, but not limited thereto. As with the above-described barriers 7, the height of the blocking members 8 varies in a range such that it is greater than or equal to 50 nm, but not greater than that of the second insulator layer 4.

Also, the blocking member 8 is preferably limited in width so that it does not touch the inner wall of the channel 40, that is, the internal surface of the second insulator layer, and also does not touch the barrier 7, which facilitates depositing a second electrode layer formed of a metal film on the printed ink layers during a subsequent step.

Figure 9:
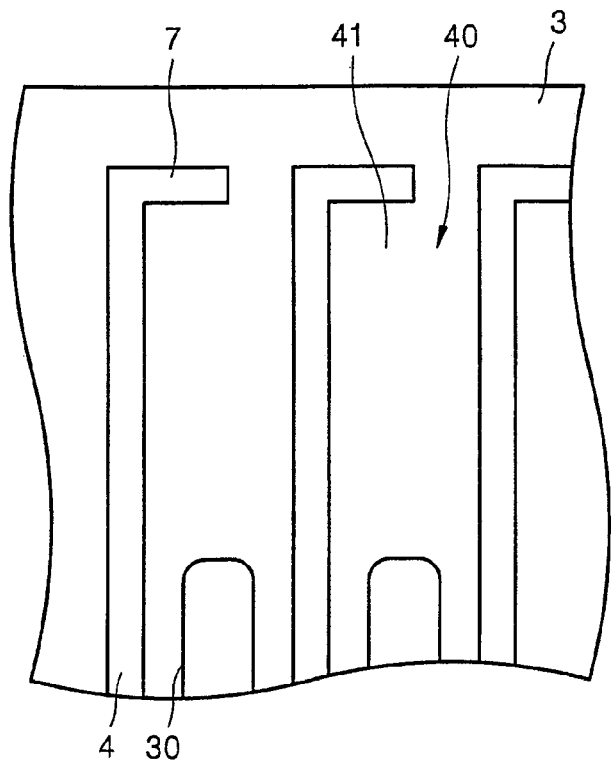
Figure 10:
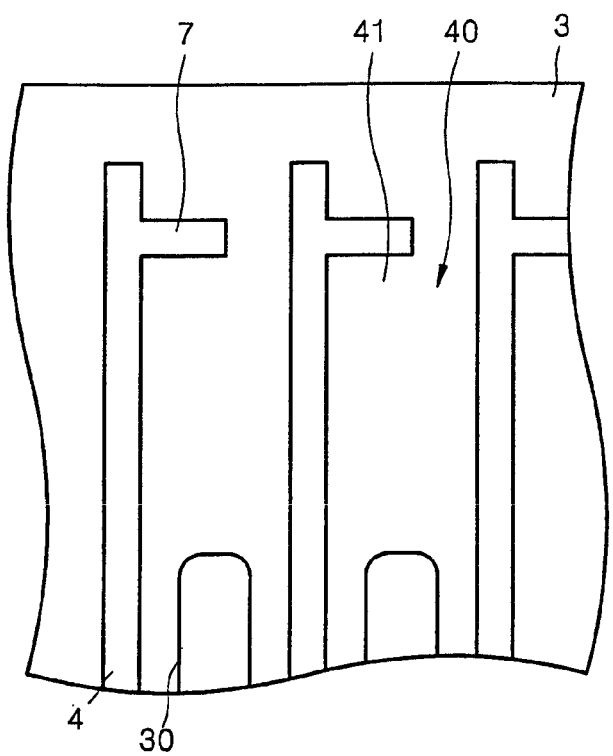

In addition to the above-described shapes, the barrier 7 can be formed in various shapes. In other words, as described above, the barrier 7 may be formed so as to extend lengthwise in a direction inclined with respect to the second insulator layer 4. As shown in FIGS. 9 and 10, the barrier 7 may also be formed so as to extend lengthwise in a direction perpendicular to the second insulator layer 4.

In detail, as shown in FIG. 9, the barrier 7 is formed so as to extend in a direction perpendicular to the second insulator layer 4 at ends 41 of the channel 40, that is, at ends of the second insulator layer 4. As shown in FIG. 10, the barrier 7 may also be formed so as to extend from an inner surface of the second insulator layer 4 at the ends 41 of the channel 40, deviating from a pixel area in a direction perpendicular to the second insulator layer 4.

As with the above-described barriers, the height of the perpendicularly extending barrier 7 is greater than or equal to 50 nm, and not greater than that of the second insulator layer 4. Also, the perpendicularly extending barrier 7 has a length small enough that it does not touch the inner surface of the second insulator layer 4, that is, smaller than the width of the channel 40.

The perpendicularly extending barrier 7 can prevent ink from flowing along the inner wall of the second insulator layer 4, and can prevent loss of or reduction in uniformity of the layer by interrupting the flow of ink from the center of the channel 40. Although the perpendicularly extending barrier 7 is rather weak in view of the effect of interrupting ink flow, it can prevent overflow of ink just by a simple structure and can also achieve the effects obtainable by the above-described blocking member.

As described above, the barrier 7 and the blocking member 8 allow the channel 40 not to be closed at its ends 41, and to be connected to the exterior sides of the ends 41. Also, the barrier 7 and the blocking member 8 have a predetermined clearance from the outermost opening 30 of each channel 40.

As described above, since both ends 41 of the channel 40 are opened, it is possible to prevent the second electrode layer from being cut around the periphery of an effective emission area.

Figure 11:
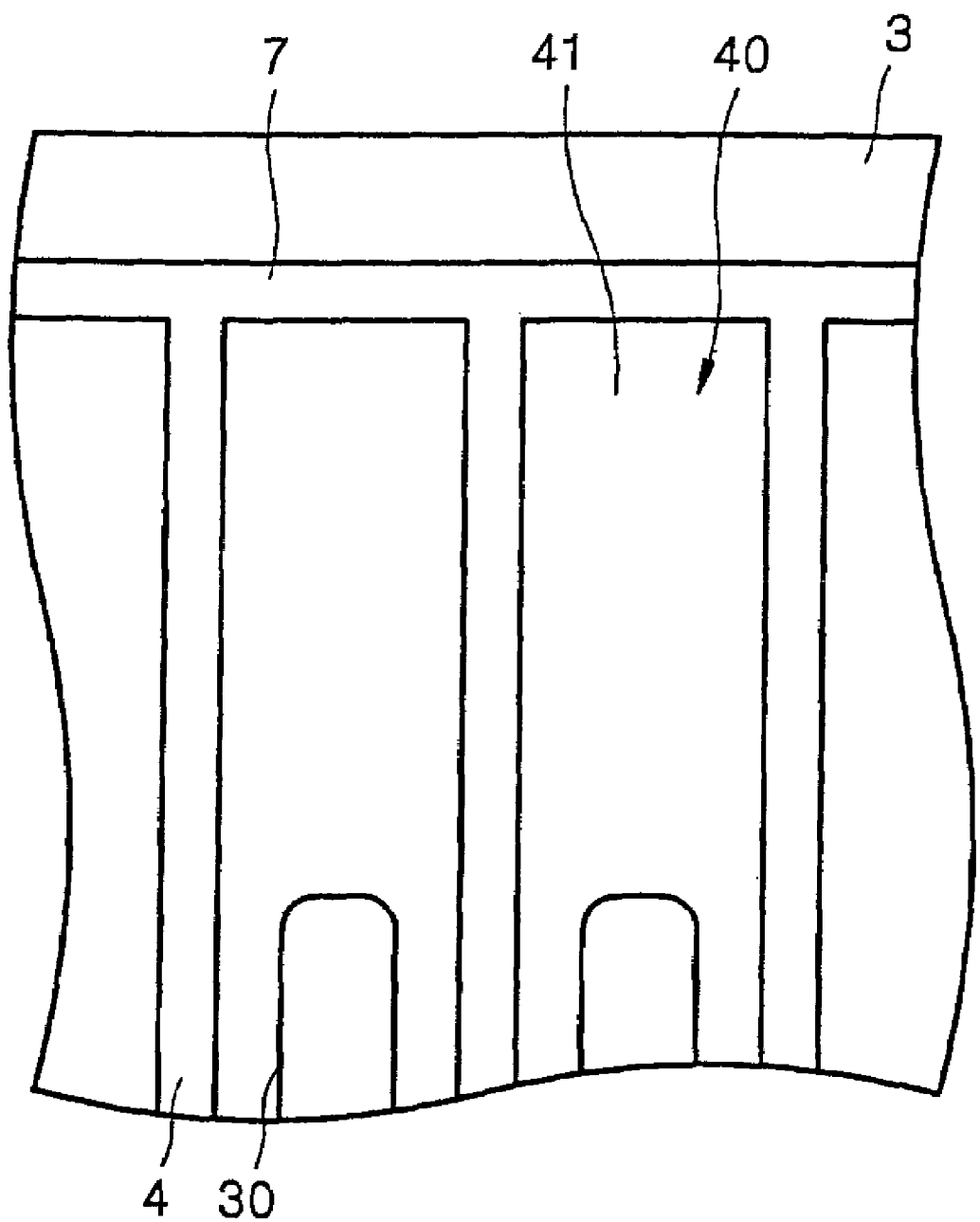

In the channel 40 with an open-end structure, both ends or either end may be constructed to be opened. In other words, as shown in FIG. 11, one end of the channel may be closed by the barrier 7 extending to touch a neighboring second insulator layer 4, while the other end of the channel is opened. In this case, a terminal of the second electrode layer can be connected via the opened end.

In addition, as shown in FIG. 11, both ends of the channel may be closed. In this case, power can be connected to the second electrode layer in a circuit manner, or by connecting a conductive layer under the barrier thereto.

In order to produce the repelling effect of the barrier 7 and the blocking member 8, as well as that of the second insulator layer 2 of the channel 40, against the HTL and the polymer ink, the substrate 1 is surface-treated in a next step. Here, the repelling effect is attained by microwave plasma treatment in the presence of a CF4/O2 gas mixture for 30 to 120 seconds.

HTL ink and the emission layer ink are applied by known methods, such as piezo ink-jet printing. With this method, the ink-jet head is positioned opposite to the substrate 1 such that the first drop of the HTL ink and/or polymer ink is positioned in the center of a channel at a clearance having a diameter corresponding to one drop of ink from the upper barrier 7.

By means of continuous pressing and displacement of the substrate 1 against the head, the channel is filled with the HTL ink and emission layer ink. The printing is stopped when the last drop of ink has a clearance having a diameter corresponding to one drop from the lower barrier 8. In the middle of forming the HTL 5 and the emission layer 6, the substrate 1 is subjected to a heat treatment for approximately 10 minutes at 130° C. in an oven in order to dry the HTL ink.

Figure 12A:
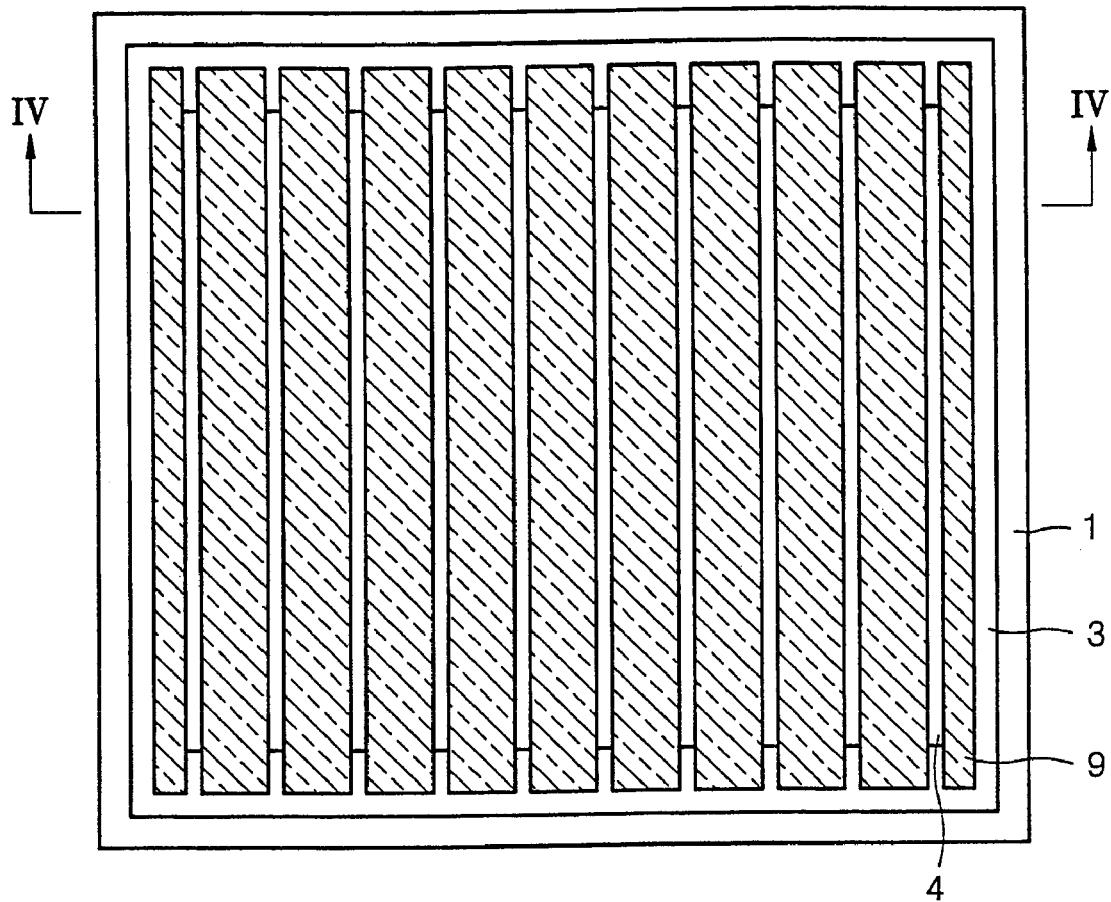
FIGS. 12A and 12B are a plan view and a cross-sectional view taken along the line IV—IV, respectively, showing the state in which a second electrode layer is formed on the substrate shown in FIGS. 3A and 3B.
Figure 12B:
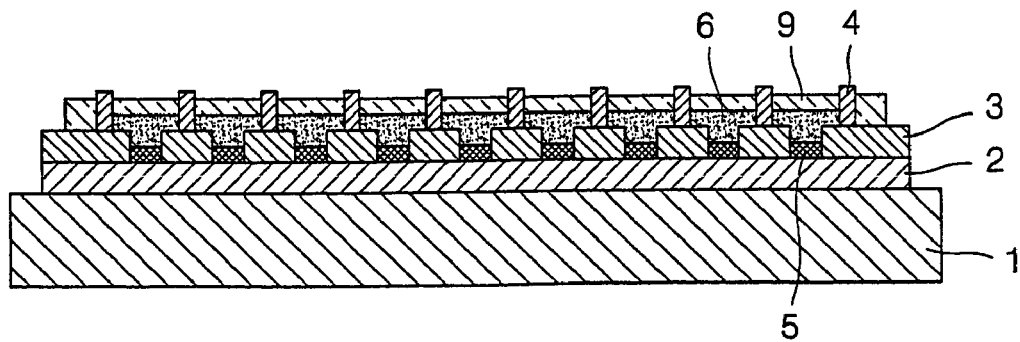

In a next step, the second electrode layer 9 is vapor-deposited with metal over the printed substrate 1, as shown in FIGS. 12A and 12B. Calcium and aluminum can be used for the second electrode layer 9. Here, known methods, e.g., thermal evaporation, are employed as the deposition method, and the second electrode layer 9 is deposited in a typical layer thickness of 1–100 nm (Ca) and 200–2000 nm (Al). The second layer 9 functions as a cathode. In addition, various materials can be employed according to device design. The second electrode layer 9 contacts a driver (not shown) outside the printed line.

Figure 13A:
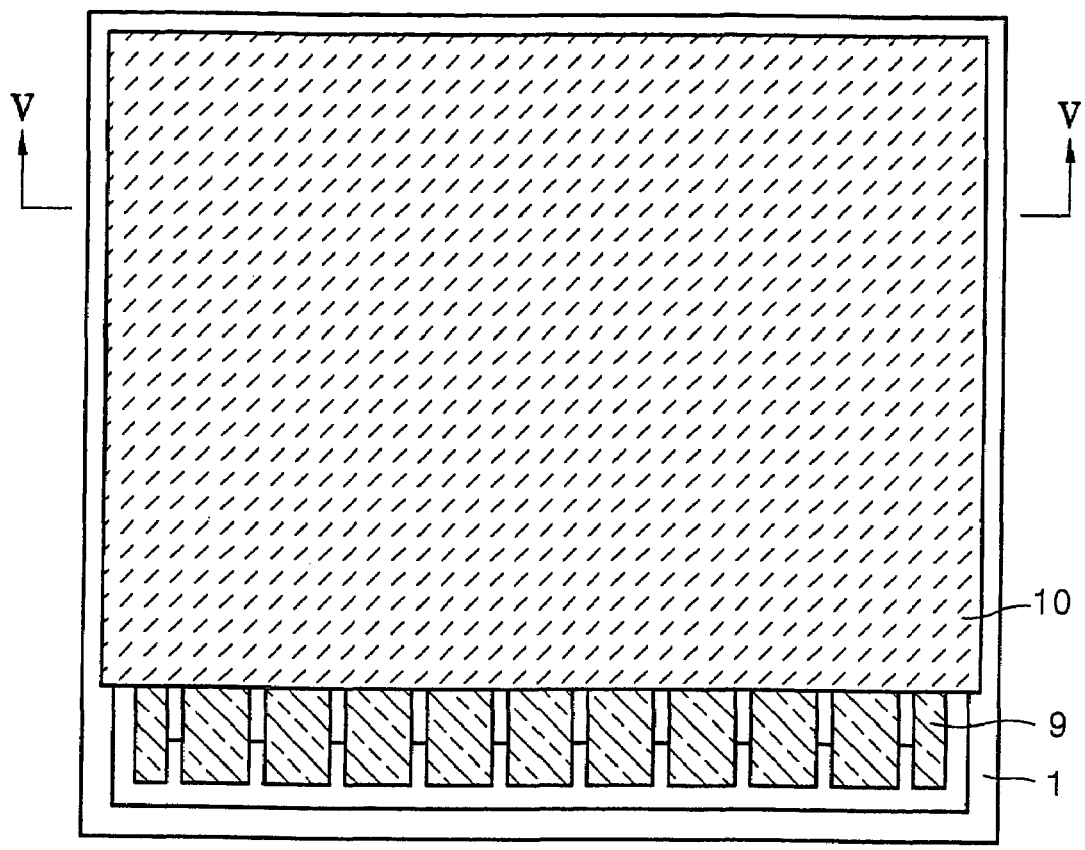
FIGS. 13A and 13B are a plan view and a cross-sectional, respectively, showing the state in which the substrate shown in FIGS. 12A and 12B is encapsulated.
Figure 13B:
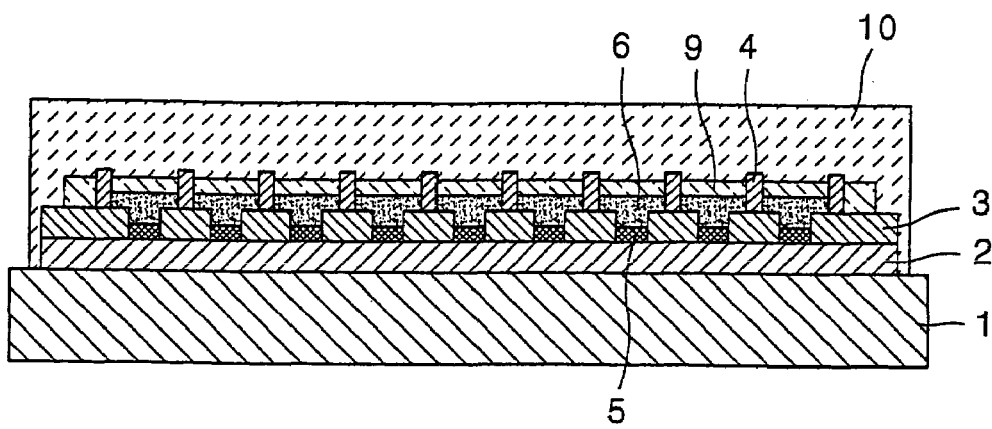

Finally, as shown in FIGS. 13A and 13B, the substrate 1 is encapsulated by means of known techniques, such as adhesion with an encapsulation plate 10, so that oxygen, water and other materials restricting the function of the polymer OLED can be isolated from the substrate 1. In addition to using the encapsulation plate 10, the encapsulating can be performed in various manners, including coating with a water-repelling resin, such as epoxy, or using a metal cap incorporating a moisture-absorbing material.

As described above, the present invention has the following advantages.

First, ink can be prevented from running out into neighboring channels along the internal wall of each channel, thereby preventing mixing of colors.

Second, a deviation in layer thickness in the entire channel can be reduced by preventing the HTL ink and polymer ink from flowing outside the channel, thereby increasing electroluminescence intensity of an OLED.

Third, for all channels, uniformity in layer thickness and electroluminescence intensity can be enhanced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An organic light emitting diode (OLED), comprising:
   a substrate having a first electrode layer formed thereon;
   an insulator layer formed on the substrate and forming a channel in a predetermined pattern;
   an organic polymer layer formed based on the channel and having at least an emission layer;
   a barrier formed at either side of the insulator layer for preventing ink for the organic polymer layer from running out of the channel; and
   a second electrode layer formed an the organic polymer layer.

2. The OLED according to claim 1, wherein the barrier extends lengthwise in a direction perpendicular to the channel.

3. The OLED according to claim 1, wherein the barrier extends lengthwise in a direction inclined with respect to the channel.

4. The OLED according to claim 1, wherein the barrier is spaced by a predetermined distance from a lateral surface of a neighboring insulator layer.

5. The OLED according to claim 1, wherein the barrier extends to a lateral surface of a neighboring insulator layer.

6. The OLED according to claim 1, wherein the barrier comprises:
   at least one first barrier for preventing the polymer ink from running out of the channel; and
   at least one second barrier for preventing the polymer ink from running in from neighboring channels.

7. The OLED according to claim 6, wherein the first and second barriers incline lengthwise with respect to the channel, the first and second barriers extending in opposite directions.

8. The OLED according to claim 7, wherein the first barrier extends lengthwise toward a center of the channel, and the second barrier extends outward from the channel.

9. The OLED according to claim 1, wherein a height of the barrier is no less than 50 nm and no greater than the height of the insulator layer.

10. The OLED according to claim 1, further comprising at least one blocking member for interrupting outflow of the organic polymer layer and provided substantially at a center of two ends of each channel.

11. The OLED according to claim 10, wherein a shape of said at least one blocking member is one of a cuboid, a cylinder, a pyramid, a wedge and a V-shape.

12. The OLED according to claim 11, wherein said at least one blocking member includes at least two elements in a wedge shape, centers of the wedge being opposite to each other.

13. The OLED according to claim 10, wherein a width of said at least one blocking member is no greater than a width of the channel.

14. The OLED according to claim 10, wherein a height of the barrier is no less than 50 nm and no greater than a height of the insulator layer.

15. The OLED according to claim 1, wherein the polymer organic layer is formed by coating a liquid polymer organic material along the channel by inkjet printing.

16. The OLED according to claim 1, wherein the barrier is formed on the insulator layer and extends outwardly from at least one of two sides of the insulator layer for preventing ink for the organic polymer layer from running out of the channel.

17. An organic light emitting diode (OLED), comprising:
a substrate having a first electrode layer formed thereon;
an insulator layer formed on the substrate and forming a channel in a predetermined pattern;
an organic polymer layer formed based on the channel and having at least an emission layer;
a barrier formed on the insulator layer; and
a second electrode layer formed on the organic polymer layer;
wherein the barrier comprises at least one first barrier for preventing ink for the organic polymer layer from running out of the channel and at least one second barrier for preventing the ink from running in from neighboring channels.

18. The OLED according to claim 17, wherein the first and second barriers incline lengthwise with respect to the channel, the first and second barriers extending in opposite directions.

19. The OLED according to claim 18, wherein the first barrier extends lengthwise toward a center of the channel, and the second barrier extends outward from the channel.

20. An organic light emitting diode (OLED), comprising:
a substrate having a first electrode layer formed thereon;
an insulator layer formed on the substrate and forming a channel in a predetermined pattern;
an organic polymer layer formed based on the channel and having at least an emission layer;
a barrier formed on the insulator layer for preventing ink for the organic polymer layer from running out of the channel;
a second electrode layer formed on the organic polymer layer; and
at least one blocking member for interrupting outflow of the organic polymer layer and provided substantially at a center of two ends of each channel;
wherein said at least one blocking member includes at least two elements in a wedge shape, centers of the wedge being opposite to each other.

* * * * *